US008900665B2

(12) United States Patent
Koshy

(10) Patent No.: US 8,900,665 B2
(45) Date of Patent: Dec. 2, 2014

(54) METHOD OF FORMING HARDMASK LAYER WITH ALTERNATING NANOLAYERS

(75) Inventor: Robin Abraham Koshy, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 138 days.

(21) Appl. No.: 13/595,574

(22) Filed: Aug. 27, 2012

(65) Prior Publication Data

US 2014/0057089 A1    Feb. 27, 2014

(51) Int. Cl.
*C23C 16/34*    (2006.01)

(52) U.S. Cl.
USPC .......... 427/255.391; 427/255.394; 427/255.7; 427/576

(58) Field of Classification Search
USPC ............... 427/255.394, 255.7, 255.391, 576
See application file for complete search history.

(56) References Cited

U.S. PATENT DOCUMENTS

| | | | |
|---|---|---|---|
| 2002/0155219 A1* | 10/2002 | Wang et al. ............ | 427/255.391 |
| 2003/0175536 A1* | 9/2003 | Penich et al. .................. | 428/469 |
| 2005/0170219 A1* | 8/2005 | Penich et al. .................. | 428/698 |
| 2007/0200243 A1* | 8/2007 | Kraus et al. .................... | 257/763 |
| 2009/0057736 A1* | 3/2009 | Udayakumar et al. ........ | 257/295 |
| 2009/0155559 A1* | 6/2009 | Xu et al. ........................ | 428/216 |
| 2010/0119819 A1* | 5/2010 | Rodgers et al. ............... | 428/334 |
| 2010/0190347 A1* | 7/2010 | RamachandraRao et al. ............. | 438/703 |
| 2010/0255337 A1* | 10/2010 | Langhorn ..................... | 428/623 |

FOREIGN PATENT DOCUMENTS

WO    WO 2007-117603    * 10/2007

OTHER PUBLICATIONS

Barshilia, Harish, C., et al., "A Raman-scattering study on the interface structure of nanolayered TiAlN/TiN and TiN/NbN multilayers thin films grown by reactive dc magnetron sputtering." Journal of Applied Physics 98, 014311 (2005), pp. 1-9.*
Zdebski, D., et al., "An analysis of the effects of nanolayered nitride coatings on the lifetimes and wear of tungsten carbide micromilling tools." Multi-Material Micro Manufacture, 2008, pp. 1-4.*
Czechowski, K., et al., "Effect of nitride nano-scale multilayer coatings on functional properties of composite ceramic cutting inserts". Bulletin of the Polish Academy of Sciences Technical Sciences, vol. 53, No. 4, 2005, pp. 425-431.*
R. A. Koshy, et al., "Temperature Activated Self-Lubrication in CrN/Mo2n Nanolayer Coatings," pp. 1359-1365, Surface & Coatings Technology 204, ELSEVIER (2010).
R. A. Koshy, "Thermally Activated Self-Lubricating Nanostructured Coating for Cutting Tool Applications," pp. 1-189, A Dissertation, Northwestern University, Illinois, U.S.A., Dec. 2008.
K. J. Martin, et al., "Mechanical Properties and Thermal Stability of TiN/TiB2 Nanolayered Thin Films," pp. 90-98, vol. 23, Issue 1, Journal of Vacuum Science & Technology A: American Vacuum Society (2005).

* cited by examiner

*Primary Examiner* — Bret Chen
(74) *Attorney, Agent, or Firm* — Ditthavong & Steiner, P.C.

(57) ABSTRACT

Forming a hardmask layer with an increased etch resistance based on alternating nanolayers of TiN with alternating residual stresses is disclosed. Embodiments include depositing a first nanolayer of TiN, and depositing a second nanolayer of TiN on the first nanolayer, wherein the first and second nanolayers have different residual stresses.

13 Claims, 5 Drawing Sheets

METHOD OF FORMING HARDMASK LAYER WITH ALTERNATING NANOLAYERS

TECHNICAL FIELD

The present disclosure relates to hardmask layers. The present disclosure is particularly applicable to hardmask layers having decreased overall residual stress and increased overall hardness and consequently etch resistance.

BACKGROUND

Hardmasks are employed as etch masks for a variety of semiconductor manufacturing processes. Titanium nitride (TiN) hardmasks have been used, for example, for forming self-aligned vertical interconnect accesses (VIAs) (the simultaneous formation of a layer metal (metalx) pattern and Via levels (Vx) VIAs). However, TiN hardmask layers have poor etch resistance, particularly at the edge of the wafer. The poor etch resistance prevents the hardmask layers from being used in processes related to, for example, trench first metal hardmask schemes, VIA double patterning schemes and merged VIAs, such as two, three, four and above numbers of merged VIAs.

A need therefore exists for methodology enabling hardmask layers with lower residual stress for enhanced etch resistance and hardness, and the resulting device.

SUMMARY

An aspect of the present disclosure is an efficient method for fabricating a hardmask layer with alternating nanolayers having alternating residual stresses.

Another aspect of the present disclosure is a hardmask layer with alternating nanolayers having alternating residual stresses.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: depositing a first nanolayer of TiN, and depositing a second nanolayer of TiN on the first nanolayer, wherein the first and second nanolayers have different residual stresses.

Aspects of the present disclosure include depositing the first and second nanolayers at different powers, different gas flow rates, or a combination thereof to obtain the different residual stresses. Additional aspects include depositing the first nanolayer at a first power of 9 to 25 kilowatts (kW), and depositing the second nanolayer at a second power of 9 to 25 kW, where the second power is different than the first power. Further aspects include depositing the first nanolayer at a first gas flow rate of nitrogen ($N_2$), and depositing the second nanolayer at a second gas flow rate of $N_2$, where the second gas flow rate is different than the first gas flow rate. Another aspect includes depositing additional first and second nanolayers, alternating, on the second nanolayer, to form a film having a thickness of 1 to 10 nanometers (nm). Yet another aspect includes forming each of the first and second nanolayers to a thickness of less than or equal to 10 nm. An additional aspect includes depositing additional first and second nanolayers, alternating, on the second nanolayer to form a film having 2 to 300 nanolayer interfaces. Another aspect includes depositing the first and second nanolayers on an interlayer dielectric (ILD) to form a hardmask layer, or depositing the first and second nanolayers as a replacement of the current hard mask material in a trench first metal hard mask process. A further aspect includes patterning the hardmask layer to expose areas to be etched.

Another aspect of the present disclosure is a device including: a substrate, and a film including a first nanolayer of TiN having a first residual stress above the substrate, and a second nanolayer of TiN having a second residual stress on the first nanolayer, wherein the first residual stress is different than the second residual stress.

Aspects include a net residual stress of the film being less than the first residual stress and less than the second residual stress. Another aspect includes the film including multiple, alternating first and second nanolayers. A further aspect includes the film having 2 to 300 nanolayer interfaces. Yet another aspect includes each of the first nanolayer and the second nanolayer having a thickness of less than or equal to 10 nm. An additional aspect includes an etch resistance of the film being greater than an etch resistance of the first or second nanolayer.

Another aspect of the present disclosure includes: depositing a plurality of first nanolayers of TiN at a first power and a first gas flow rate over a substrate, and depositing a plurality of second nanolayers of TiN, alternating with the first nanolayers, at a second power, different than the first power, and a second gas flow rate, different than the first gas flow rate, each second nanolayer being deposited on a different first nanolayer, wherein the first and second nanolayers form a film having 2 to 300 nanolayer interfaces.

Another aspect includes each of the first nanolayer and the second nanolayer having a thickness of less than or equal to 10 nm. Further aspects include depositing the first nanolayers at a first power of 9 to 25 kW, and depositing the second nanolayers at a second power of 9 to 25 kW, where the second power is different than the first power. Additional aspects include depositing the first nanolayers at a first gas flow rate of $N_2$, and depositing the second nanolayers at a second gas flow rate of $N_2$, where the second gas flow rate is different than the first gas flow rate. Yet additional aspects include forming the film on an ILD over a substrate to form a hardmask layer, and patterning the film to form openings for a metal pattern and VIAs to be etched.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of poor etch resistance attendant upon etching semiconductor patterns therethrough. In accordance with embodiments of the present disclosure, a hardmask layer is formed by depositing alternating nanolayers of TiN with alternating residual stresses resulting in a hardmask layer with a net residual stress lower than either of the nanolayers and an increased hardness and etch resistance.

Methodology in accordance with embodiments of the present disclosure includes depositing a first nanolayer of TiN, and depositing a second nanolayer of TiN on the first nanolayer, wherein the first and second nanolayers have different residual stresses. The different residual stresses may be obtained by depositing the first and second nanolayers at different powers, different gas flow rates, or a combination thereof. The nanolayers may form a hardmask layer on an ILD, and the hardmask layer may be subsequently patterned to expose areas of the ILD to be etched.

Figure 1:
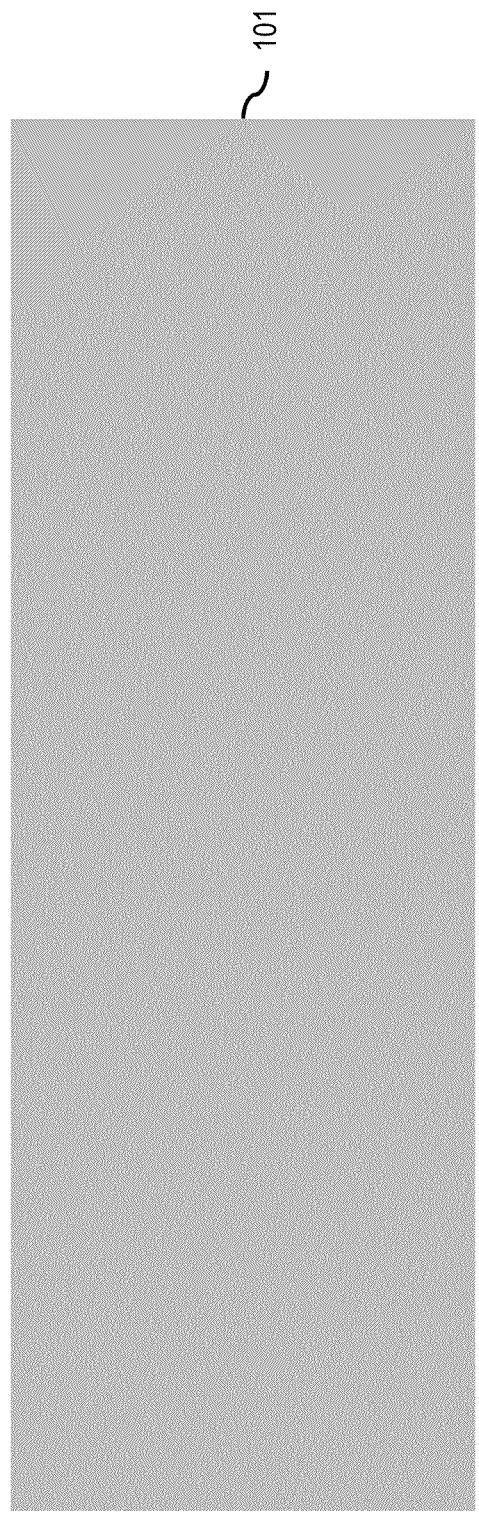
FIGS. 1 through 4 schematically illustrate a method for forming a hardmask layer including alternating nanolayers of alternating residual stresses, in accordance with an exemplary embodiment.

Adverting to FIG. 1, a method of forming a hardmask layer having nanolayers of varying residual stresses, in accordance with an exemplary embodiment, begins with a base layer 101. The base layer 101 may be any type of layer that may subsequently have a hardmask layer deposited on it or over it, such as an ILD in the manufacturing of a semiconductor device. The hardmask layer may be deposited directly on the base layer 101, or may be deposited over one or more additional layers between the hardmask layer and the base layer 101, depending on the specifics of the process.

Figure 2:
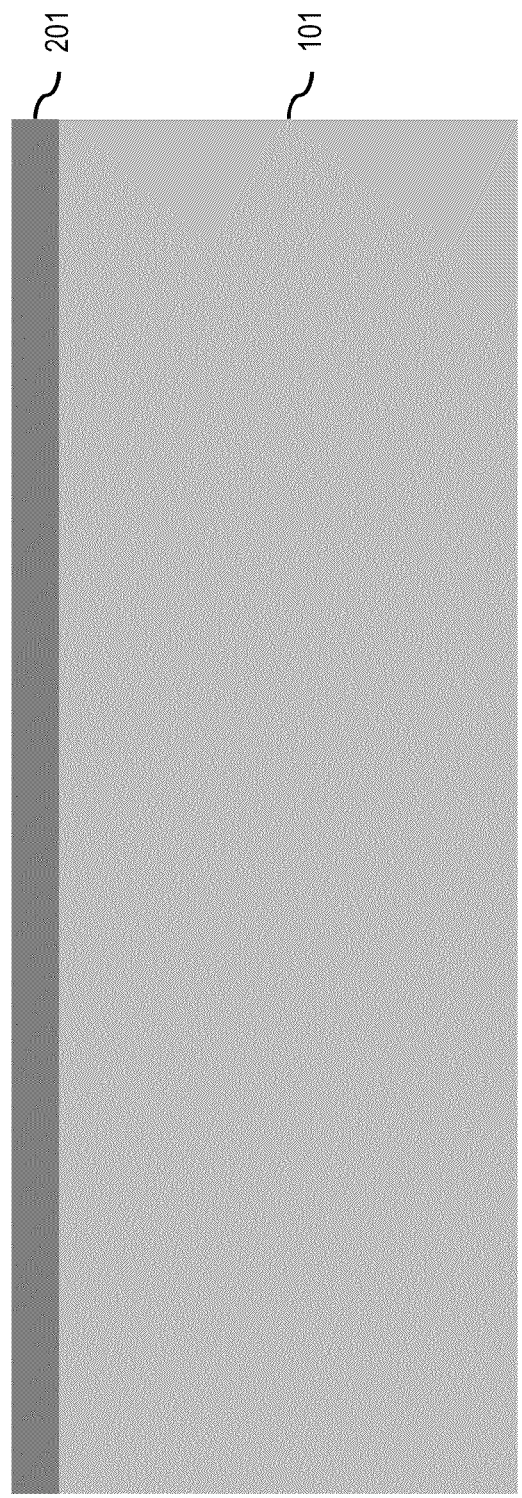

Next, a first nanolayer 201 of TiN may be deposited over the base layer 101 to a thickness of less than or equal to 10 nanometers (nm), as illustrated in FIG. 2. The first nanolayer 201 may be deposited to have a first residual stress. The first residual stress may be controlled by depositing the first nanolayer 201 at a first power, such as 9 to 25 kW. Alternatively, the first residual stress may be controlled by depositing the first nanolayer 201 at a first gas flow rate of nitrogen ($N_2$). Alternatively, the first residual stress may be controlled by depositing the first nanolayer 201 at a combination of the first power and the first gas flow rate.

Figure 3:
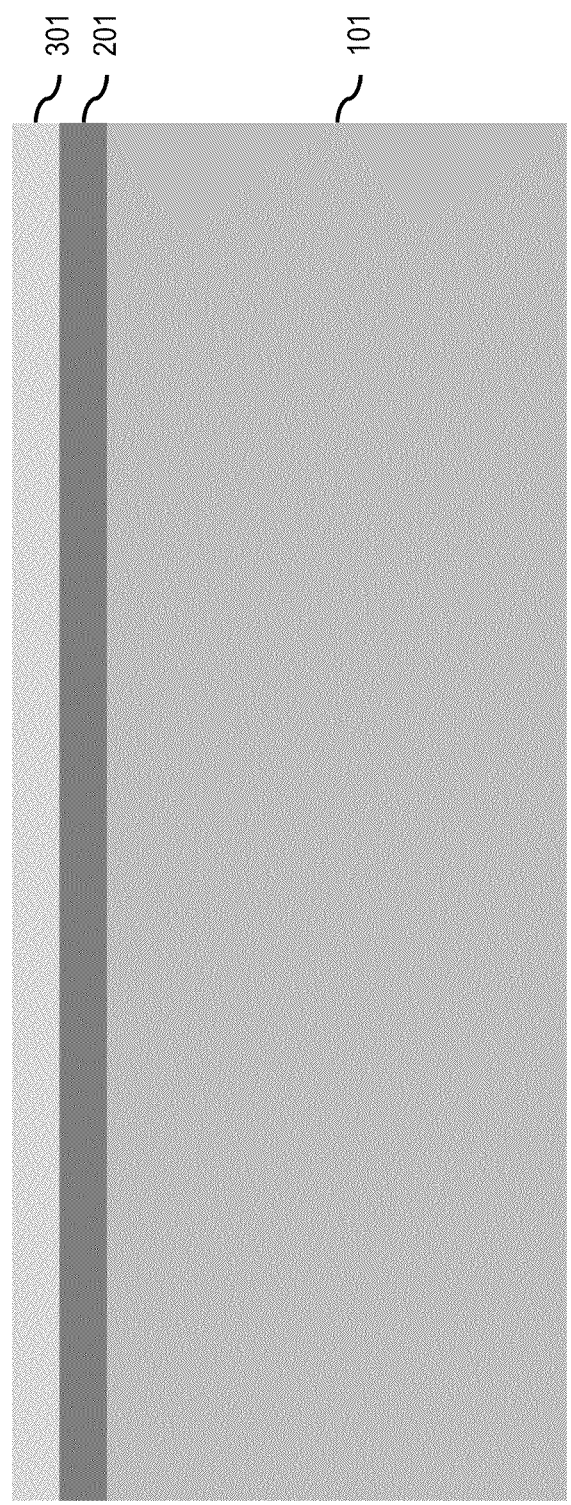

Adverting to FIG. 3, a second nanolayer 301 of TiN may be deposited over the first nanolayer 201 to a thickness of less than or equal to 10 nm. The second nanolayer 301 may be deposited to have a second residual stress, where the second residual stress is different than the first residual stress of the first nanolayer 201. The second residual stress is a function of depositing the second nanolayer 301 at a second power of 9 to 25 kW, and where the second power is different than the first power. Further, the first and second powers (and consequently the stresses) may be reversed. Thus, where the first power is, for example, 9 kW to deposit the first nanolayer 201, the second power to deposit the second nanolayer 301 may be, for example, 23 kW. Alternatively, the first power to deposit the first nanolayer 201 may be 23 kW, and the second power to deposit the second nanolayer 301 may be 9 kW.

Alternatively, the second residual stress may be controlled by depositing the second nanolayer 301 at a second gas flow rate of $N_2$, where the second gas flow rate is different than the first gas flow rate, such as where the second gas flow rate is higher than the first gas flow rate. Alternatively, the first and second gas flow rates (and consequently the stresses) may be reversed. Thus, the second gas flow rate may be lower than the first gas flow rate.

Alternatively, the second residual stress may be controlled by depositing the second nanolayer 301 at a different power and a different gas flow rate compared to the first nanolayer 201. Indeed, the powers and the gas flow rates may be controlled to maximize the number of interfaces of the first and second nanolayers 201 and 301.

Figure 4:
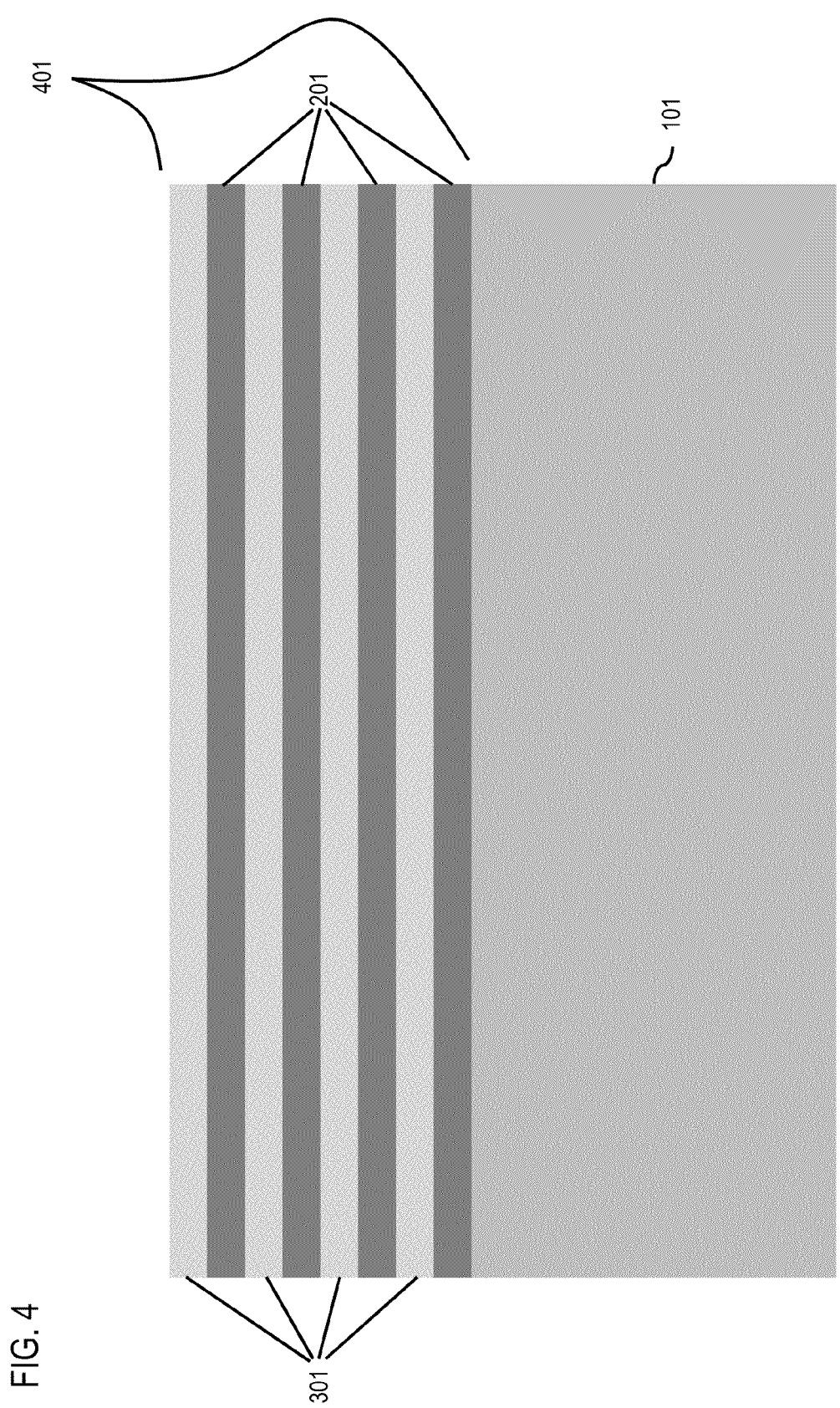

As illustrated in FIG. 4, subsequent alternating first and second nanolayers 201 and 301 may be deposited on the second nanolayer 301 to form a hardmask layer 401. The subsequent first and second nanolayers 201 and 301 may be formed by depositing the TiN while pulsing the power and/or the gas flow rate between the two powers, the two gas flow rates, or a combination thereof, as discussed above. Thus, the first and second nanolayers 201 and 301 may be repeatedly deposited N times, where N may be 1 to 150. By controlling the number of nanolayers 201 and 301, thereby controlling the number of interfaces between the nanolayers 201 and 301, as the residual stress builds in each nanolayer 201 and 301, vacancies created in the nanolayers 201 and 301 can diffuse between the interfaces to minimize the net stress of the film 401.

The hardmask layer 401 may be formed to a thickness of 1 to 10 nm and may include 2 to 300 interfaces of the first and second nanolayers 201 and 301. By forming the hardmask layer 401 of the alternating first and second nanolayers 201 and 301 with alternating residual stresses, the hardmask layer 401 may have a lower residual stress than either of the first and second nanolayers 201 and 301. The lower residual stress of the hardmask layer 401 provides enhanced hardness and etch resistance allowing the hardmask layer 401 to be used in trench first metal hardmask schemes, VIA double patterning schemes, and merged VIAs, where previous conventional hardmask layers may have failed.

Figure 5:
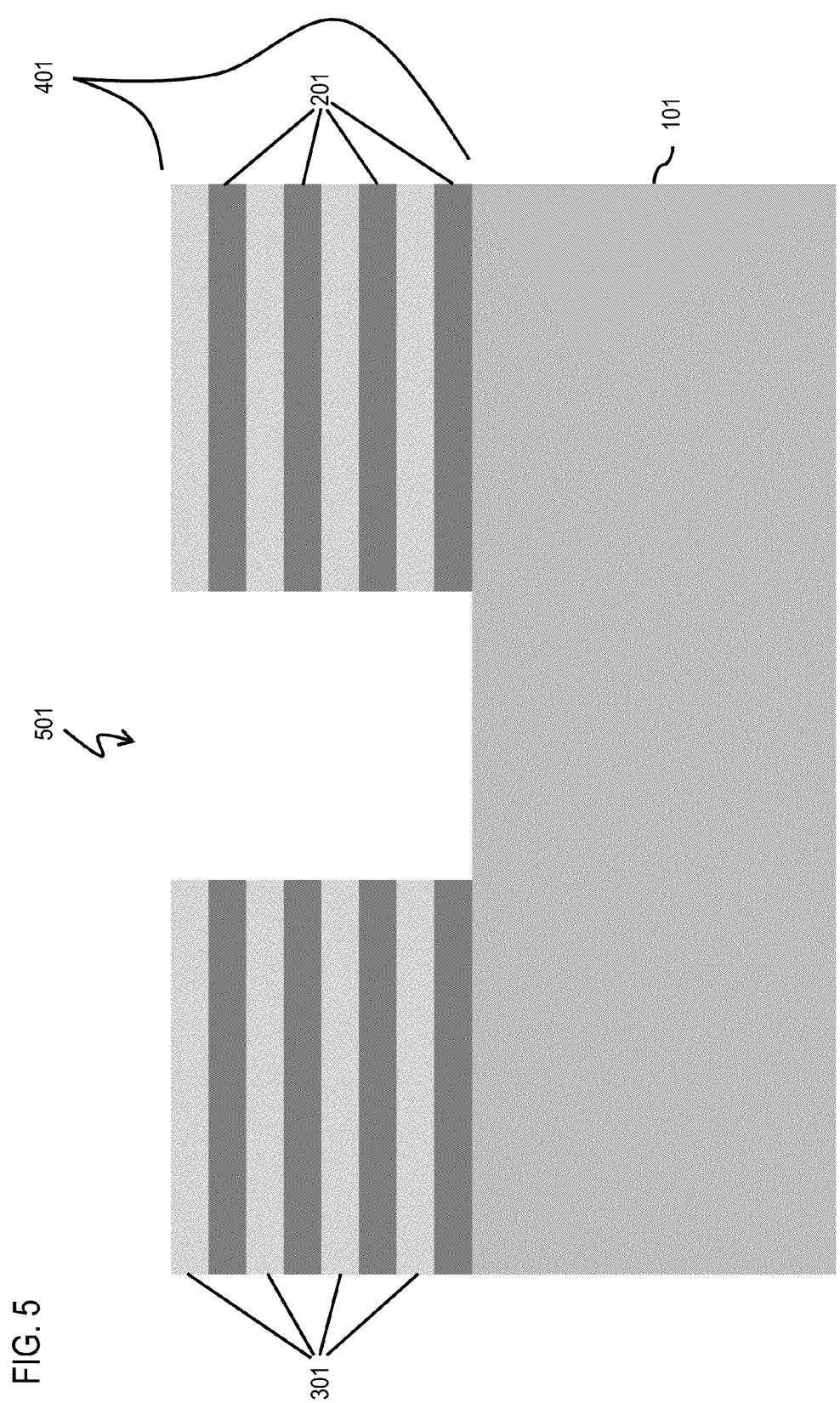
FIG. 5 schematically illustrates a hardmask layer of FIGS. 1 through 4 patterned to expose an area to be etched, in accordance with an exemplary embodiment.

Adverting to FIG. 5, the hardmask layer 401 may be subsequently patterned to form an opening 501 to form a metal pattern and/or a VIA pattern above the base layer 101 so that the base layer 101 may be subsequently etched. Based on the lower residual stress and increased hardness provided by the nanolayers of alternating residual stresses caused by pulsing the power and/or gas flow rate during the deposition, the hardmask layer 401 exhibits better etch resistance than a conventional hardmask layer.

The embodiments of the present disclosure achieve several technical effects, including providing a hardmask layer with lower residual stress and increased etch resistance such that the hardmask layer may be used in first metal hardmask schemes and VIA double patterning schemes. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of forming a hardmask layer comprising:
depositing a first nanolayer of titanium nitride (TiN) on an interlayer dielectric (ILD) at first deposition conditions, the first nanolayer having a first residual stress; and
depositing a second nanolayer of TiN on the first nanolayer at second deposition conditions, the second nanolayer having a second residual stress,
wherein the first and second residual stresses are different, and a residual stress of the hardmask layer is lower than the first and second residual stresses.

2. A method according to claim 1, wherein the first and second deposition conditions comprise different powers, different gas flow rates, or a combination thereof to obtain the different residual stresses.

3. A method according to claim 1, comprising:
depositing the first nanolayer at a first power of 9 to 25 kilowatts (kW); and
depositing the second nanolayer at a second power of 9 to 25 kW,
wherein the second power is different than the first power.

4. A method according to claim 1, comprising:
depositing the first nanolayer at a first gas flow rate of nitrogen ($N_2$); and
depositing the second nanolayer at a second gas flow rate of $N_2$,
wherein the second gas flow rate is different than the first gas flow rate.

5. A method according to claim 1, further comprising depositing additional first and second nanolayers, alternating, on the second nanolayer, to form the hardmask layer having a thickness of 1 to 10 nm.

6. A method according to claim 5, comprising forming each of the first and second nanolayers to a thickness of less than or equal 10 nanometer (nm).

7. A method according to claim 1, further comprising depositing additional first and second nanolayers, alternating, on the second nanolayer to form the hardmask layer having 2 to 300 nanolayer interfaces.

8. A method according to claim 1, further comprising patterning the hardmask layer to expose areas to be etched.

9. A method of forming a hardmask layer comprising:
depositing a plurality of first nanolayers of titanium nitride (TiN) at a first power and a first gas flow rate over a substrate, the first nanolayers having a first residual stress; and
depositing a plurality of second nanolayers of TiN, alternating with the first nanolayers, at a second power, different than the first power, and a second gas flow rate, different than the first gas flow rate, each second layer being deposited on a different first nanolayer and having a second residual stress,
wherein the hardmask layer includes 2 to 300 nanolayer interfaces based on the alternating first and second nanolayers, and the hardmask layer has a residual stress that is lower than the first and second residual stresses.

10. A method according to claim 9, wherein each of the first nanolayer and the second nanolayer has a thickness of less than or equal to 10 nm.

11. A method according to claim 9, wherein:
the first power is 9 to 25 kW,
the second power is 9 to 25 kW, and
the second power is different than the first power.

12. A method according to claim 9, comprising:
depositing the first nanolayers at a first gas flow rate of nitrogen $N_2$; and
depositing the second nanolayers at a second gas flow rate of $N_2$,
wherein the second gas flow rate is different than the first gas flow rate.

13. A method according to claim 9, further comprising:
patterning the hardmask layer to form openings for a metal pattern and vertical interconnect accesses (VIAs) to be etched.

* * * * *